United States Patent [19]
Gill et al.

[11] Patent Number: 5,012,307
[45] Date of Patent: Apr. 30, 1991

[54] ELECTRICALLY-ERASABLE, ELECTRICALLY-PROGRAMMABLE READ-ONLY MEMORY

[75] Inventors: Manzur Gill, Rosharon; Sebastiano D'Arrigo; Sung-Wei Lin, both of Houston, all of Tex.

[73] Assignee: Texas Instruments Incoprorated, Dallas, Tex.

[21] Appl. No.: 494,060

[22] Filed: Mar. 15, 1990

Related U.S. Application Data

[63] Continuation of Ser. No. 219,530, Jul. 15, 1988, abandoned.

[51] Int. Cl.$^5$ .................... H01L 29/68; H01L 29/34; G11C 11/34
[52] U.S. Cl. .................... 357/23.5; 357/54; 365/185
[58] Field of Search .................... 357/23.5; 365/185

[56] References Cited

U.S. PATENT DOCUMENTS

| | | | |
|---|---|---|---|
| 4,180,826 | 12/1979 | Shappir | 357/41 |
| 4,203,158 | 5/1980 | Frohman-Bentchkowsky | 365/185 |
| 4,377,818 | 3/1983 | Kuo et al. | 357/23.5 |
| 4,377,857 | 3/1983 | Tickle | 365/185 |
| 4,493,057 | 9/1984 | McElroy | 365/182 |
| 4,590,504 | 5/1986 | Gutterman | 357/23.11 |
| 4,622,737 | 11/1986 | Ravaglia | 357/23.5 |
| 4,668,970 | 5/1987 | Yatsuda et al. | 357/23.5 |
| 4,686,558 | 8/1987 | Adam | 357/23.5 |
| 4,750,024 | 6/1988 | Schreck | 357/23.5 |

FOREIGN PATENT DOCUMENTS 0105802 4/1984 European Pat. Off. .
0144900 6/1985 European Pat. Off. .
85/01146 3/1985 PCT Int'l Appl. .

*Primary Examiner*—Rolf Hille
*Assistant Examiner*—Robert P. Limanek
*Attorney, Agent, or Firm*—W. James Brady, III; James T. Comfort; Melvin Sharp

[57] ABSTRACT

An electrically-erasable, programmable ROM cell, or an EEPROM cell, is constructed using an enhancement transistor merged with a floating-gate transistor, where the floating-gate transistor has a small tunnel window, in a contact-free cell layout, enhancing the ease of manufacture and reducing cell size. The bitlines and source/drain regions are buried beneath relatively thick silicon oxide, which allows a favorable ratio of control gate to floating gate capacitance. Programming and erasing are provided by the tunnel window are near or above the channel side of the source. The window has a thinner dielectric than the remainder of the floating gate, to allow Fowler-Nordheim tunneling. By using dedicated drain or ground lines, rather than a virtual-ground layout, and by using thick oxide for isolation between bitlines, the floating gate can extend onto adjacent bitlines and isolation area, resulting in a favorable coupling ratio. Isolation between wordlines is also by thick thermal oxide in a preferred embodiment, further improving the coupling ratio. Bitline and wordline spacing may be selected for optimum pitch or aspect ratio. Bitline to substrate capacitance is minimized.

10 Claims, 3 Drawing Sheets

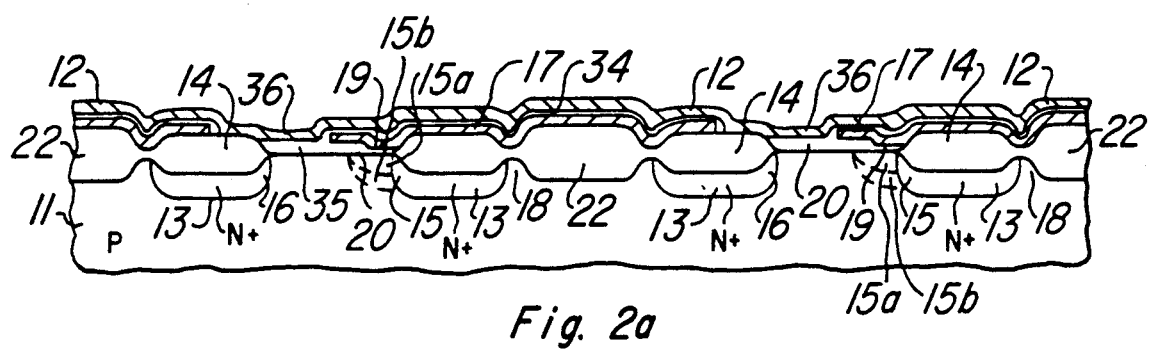
Fig. 2a
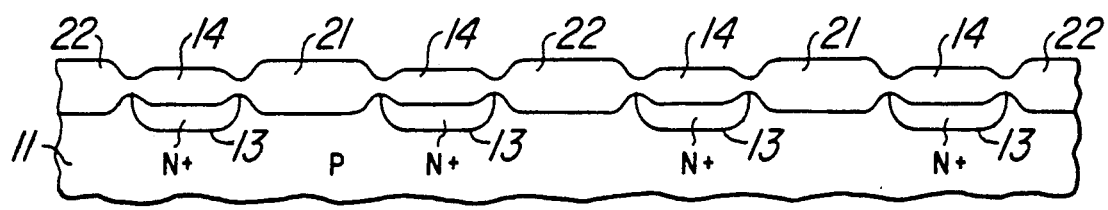
Fig. 2b
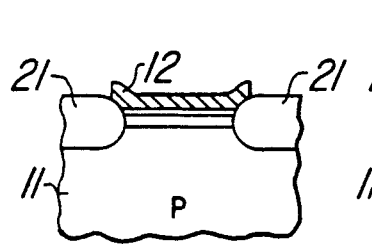 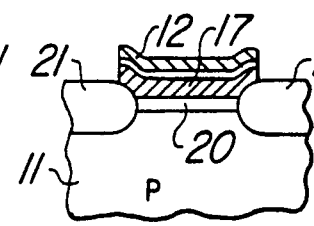 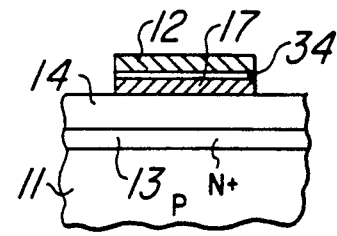
Fig. 2c        Fig. 2d        Fig. 2e
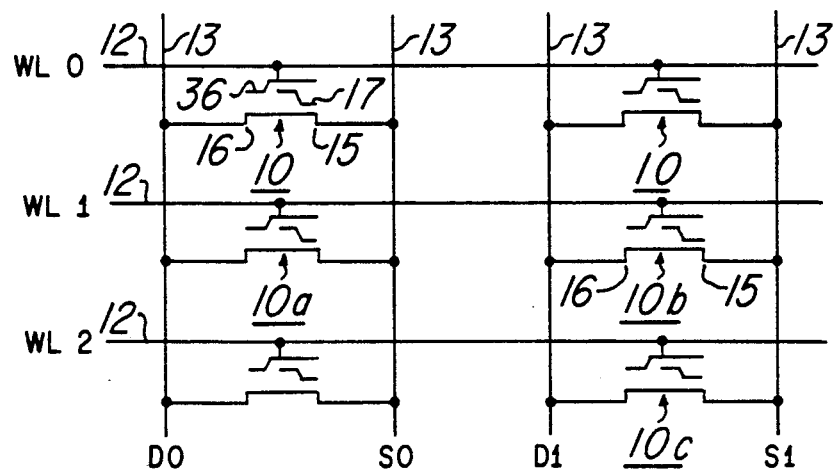
Fig. 3

ELECTRICALLY-ERASABLE, ELECTRICALLY-PROGRAMMABLE READ-ONLY MEMORY

RELATED APPLICATIONS

This application is a continuation of pending U.S. patent application Ser. No. 07/219,530, filed July 15, 1988 now abandoned.

This application discloses subject matter also disclosed in co-pending U.S. patent applications Ser. No. 07/494,051, which is a continuation of U.S. patent application Ser. No. 07/219,528, filed July 15, 1988, and 07/494,042, which is a continuation of U.S. patent application Ser. No. 07/219,529 filed July 15, 1988, filed herewith and assigned to Texas Instruments Incorporated. The foregoing applications are hereby incorporated herein by reference.

BACKGROUND OF THE INVENTION

This invention relates to semiconductor memory devices, and more particularly to an electrically-erasable, electrically-programmable ROM (read-only memory) of the floating-gate type, and to a method for making such a device.

EPROMs, or electrically-programmable ROMs, are field-effect devices with a floating-gate structure. An EPROM floating gate is programmed by applying proper voltage to the source, drain and control gate of each cell, causing high current through the source-drain path and charging of the floating gate by hot electrons. The EPROM type of device is erased by ultraviolet light, which requires a device package having a quartz window above the semiconductor chip. Packages of this type are expensive in comparison with the plastic packages ordinarily used for other memory devices such as DRAMs (dynamic-random-access-memories). For this reason, EPROMs are generally more expensive than plastic-packaged devices. EPROM devices of this type, and methods of manufacture, are disclosed in U.S. Pat. Nos. 3,984,822; 4,142,926; 4,258,466; 4,376,947; 4,326,331; 4,313,362; or 4,373,248; for example. Of particular interest to this invention is U.S. Pat. No. 4,750,024, issued June 7, 1988 and filed Feb. 18, 1986 by John F. Schreck and assigned to Texas Instruments Incorporated, where an EPROM is shown made by a method similar to that of U.S. Pat. No. 4,258,466; but with an offset floating gate.

EEPROMs, or electrically-erasable, electrically-programmable ROMs, have been manufactured by various field-effect-type processes, usually requiring a much larger cell size than standard EPROMs and requiring more complex manufacturing processes. EEPROMs can be mounted in opaque plastic packages that reduce the packaging cost. Nevertheless, EEPROMs have been more expensive on a per-bit basis, in comparison with EPROMs, due to larger cell size and to more complex manufacturing processes.

Flash EEPROMS have the advantage of smaller cell size in comparison with standard EEPROMs because the cells are not erased individually. Instead, the array of cells is erased in bulk.

Currently available flash EEPROMs require two power supplies, one for programming and erasing and another for reading. Typically, a 12-volt power supply is used for programming and erasing and a 5-volt power supply is used during read operations. It is desirable, however, to employ a single relatively low-voltage supply for all of the programming, erasing and reading operations.

It is the object of this invention to provide an electrically programmable memory, or an electrically-erasable and electrically-programmable memory, that uses a single, relatively low voltage, external supply for both programming and erasing, allowing the memory device to be compatible with on-board or in-circuit programming where systems have a single external power supply. It is also an object to provide a non-volatile memory that can be packaged in a less expensive opaque plastic package. An additional object is to provide an electrically-programmable memory that does not require high current for programming. A further object is to provide an improved method of making an EEPROM or a flash EEPROM, as well as an improved cell for an EEPROM or a flash EEPROM, the manufactured cell using thick oxide insulation between wordlines and bitlines and providing improved coupling between control gate and floating gate for programming and erasing operations.

SUMMARY OF THE INVENTION

In accordance with one embodiment of the invention, an electrically-erasable PROM or an EEPROM is constructed using an enhancement transistor merged with a floating-gate transistor. The floating-gate transistor has a small tunnel window adjacent the source, in a contact-free cell layout, enhancing the ease of manufacture and reducing cell size. The device has bitlines (source/drain regions) that are buried beneath relatively thick silicon oxide, allow a favorable ratio of control gate to floating gate capacitance. Programming and erasing are accomplished using the tunnel window area near the source. The window has a thinner dielectric than the remainder of the floating gate to allow Fowler-Nordheim tunneling. By using dedicated drain and ground lines, rather than a virtual-ground layout, and by using thick oxide for isolation between the bitlines of adjacent cells, the floating gate can extend onto adjacent bitlines and isolation areas, resulting in a favorable coupling ratio. Isolation between wordlines/control gates is also by thick thermal oxide in a preferred embodiment, allowing the floating gate and control gate to extend out over this oxide adjacent the channel, further improving the coupling ratio.

BRIEF DESCRIPTION OF THE DRAWINGS

The novel features believed characteristics of the invention are set forth in the appended claims. The invention itself, however, as well as other objects and advantages thereof, will be best understood by reference to the following description of particular embodiments thereof, when read in conjunction with the accompanying drawings, in which:

FIGS. 2a-2e are elevation views in section of the semiconductor device of FIG. 1, taken along the lines a—a, b—b, c—c, d—d, and e—e of FIG. 1;

FIG. 3 is an electrical schematic diagram of the cells of FIGS. 1 and 2a-2e.

DETAILED DESCRIPTION OF SPECIFIC EMBODIMENT

Figure 1:
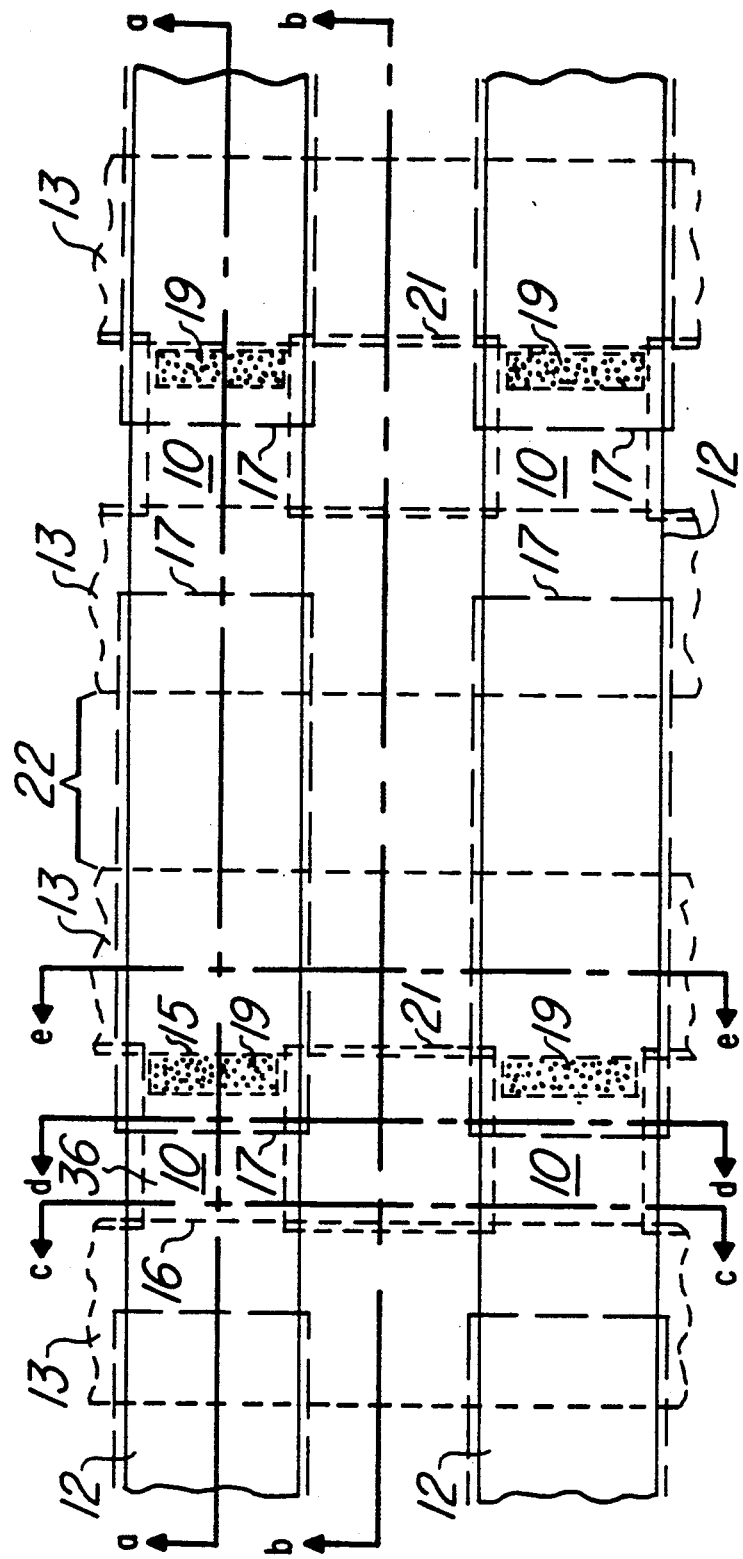
FIG. 1 is a plan view of a small part of a semiconductor chip having memory cells according to one embodiment.

Referring now to FIGS. 1, 2a-2d and 3, an array of electrically-erasable, electrically-programmable memory cells 10 is shown formed in a face of a silicon substrate 11. Only a very small part of the substrate is shown in the Figures, it being understood that these cells are part of an array of a very large number of such cells. A number of wordlines/control gates 12 are formed by second-level polycrystalline silicon (polysilicon) strips extending along the face of the substrate 11, and bitlines 13 are formed beneath thick thermal silicon oxide layers 14 in the face. The buried bitlines 13 create the source region 15 and the drain region 16 for each of the cells 10. A floating gate 17 for each cell is formed by a first-level polysilicon layer extending across about half of a cell and across one bitline and extending over onto another adjacent bitline 13. Two "horizontal" or X-direction edges of the floating gate 17 for a cell are aligned with the edges of a wordline/control gate 12. A tunnel area 19 for programming and erasing is formed near the source 15 of each cell 10, and silicon oxide at this window 19 is thinner, about 100 A, compared to the dielectric coating 20 of about 350 A for the remainder of the channel beneath the floating gate 17. Programming and erasing can be performed using a relatively low externally-applied voltage when the structure of the invention is employed, with Fowler-Nordheim tunnelling requiring very little current. The coupling between layer 12 and layer 17, compared to coupling between floating gate 17 and source 15 or substrate 11, is more favorable because the floating gate extends out across the bitlines 13 and isolating area 22. Therefore, a larger fraction of the programming/erasing voltages applied between control gate 12 and source 15 will appear between floating gate 17 and source 15. The cell 10 is referred to as "contact-free" in that no source/drain contact is needed in the vicinity of cell itself.

In contrast to the device of co-pending U.S. patent application Ser. No. 07/494,051 filed herewith, areas 21 of "LOCOS" thick field oxide are used to isolate cells from one another in the Y-direction. As in the device described in that co-pending application, strips 22 of LOCOS thick field oxide separate bitlines 13 between cells in the X-direction. One advantage of using LOCOS isolation between the wordlines and for source/drain isolation is that both the X and Y pitch (distance between common points of adjacent cells) as well as pitch (ratio of length to width) of the cell array can be adjusted to fit with the array decoders or other peripheral circuitry, and yet the coupling ratio remains favorable because the overlap of the control and the floating gates 17 may be adjusted over both the buried bitline oxide 14 and the LOCOS oxides 21 and 22. Another advantage is improved isolation from wordline 12 to wordline 12 and from bitline 13 to bitline 13. Furthermore, the capacitance between each bitline 13 and the substrate 11 is less than the capacitance associated with use of junction isolation such as that of the device disclosed in the foregoing application. In addition, the channel width is defined at an early stage during the processing, at which stage the surface of the substrate 11 is still fairly planar.

Note that the array of cells 10 is not of the "virtual-ground-circuit" type. That is, there are two bitlines 13 or column lines (one for source, one for drain) for each column (Y-direction) of cells, one bitline 13 being a dedicated ground, and one being the data input/output and sense line.

The EEPROM cells 10 of FIGS. 1, 2a-2e and 3 are programmed with a voltage Vpp applied to the selected wordline 12 of about +16 to +18 v with respect to the source 15 of the selected cell 10. The source 15 of the selected cell 10 is at ground or other reference voltage. For example, in FIG. 3, if the cell 10a is the one to be programmed, then the wordline 12 labelled WL1 is brought to +Vpp and the source labelled S0 is grounded. The voltage +Vpp can be internally generated with charge pumps on the chip, with the externally-applied supply voltage having a relatively small positive potential, perhaps +5 v. The selected drain 16 (labelled D0 in this example) is allowed to float under these programming conditions so there is little or no current through the source-drain path. The Fowler-Nordheim tunneling across the tunnel oxide 19 (with thickness of about 100 A) charges the floating gate 17 of the selected cell 10a, resulting in a shift in threshold voltage of perhaps 3-6 volts after a programming pulse approximately 10 milliseconds in length.

A selected cell is erased by applying a voltage Vee (internally-generated) of perhaps −10 v on the selected wordline/control gate 12 and a voltage of about +5 v on the source 15 or bitline 13. The drain 16 (the other bitline 13) is allowed to float. During erasure tunneling, electrons flow from the floating gate 17 to the source 15 because the control gate 12 is negative with respect to the source 15.

When a "flash erase" is performed (all cells 10 erased at the same time), all of the drains 16 in the array are allowed to float, all of the sources 15 are at potential Vdd, and all of the wordlines/control gates 12 are at potential −Vee.

To prevent a write-disturb condition during the programming example (cell 10a being programmed), all of the sources 15 of non-selected cells, such as cell 10b, on the same wordline WL1 of FIG. 3 are held at a voltage Vb1, which is in the approximate range of 5-7 volts positive. The drains 16 of non-selected cells such as 10b are allowed to float, preventing source-drain current from flowing. The voltage Vb1 applied to the source prevents the electric fields across the tunnel oxides 19 of the cells, including example cell 10b, from becoming large enough to charge the floating gates 17.

Another condition to be avoided is the "bitline stress", or deprogramming, associated with a high electric field across the tunnel oxide of a programmed cell when the source of the cell is at a potential near Vb1. To prevent this bitline stress condition, the non-selected wordlines/control gates WL0 and WL2 of FIG. 3 are held at a voltage in the approximate range of 5-10 volts positive, thereby reducing the electric field across the tunnel oxide 19 of each non-selected programmed cell. A programmed cell such as 10c has a potential of about −2 to −4 volts on its floating gate, so when the voltage Vb1 on the source S1 of such a cell 10c is in the range of 5-7 volts positive, the field across the tunnel oxide tends to deprogram the cell, but with a voltage in the range of 5-10 volts positive on the wordline WL2, the field is reduced. The voltage on the wordline/control gate is not so great, however, as to cause a change in threshold voltage Vt in a cell having no charge on its floating gate.

The cells described above may be read at low voltage. For example, a row of cells may be read by placing +3 v on the selected wordline/control gate, zero volts on all the other wordlines/control gates, zero volts on all of the sources, and +1.5 v on all of the drains. In this condition, the source-drain path of a cell will be conductive in an erased or non-programmed state (a cell with zero charge on its floating gate), i.e., storing a logic one. A programmed cell (programmed to the high-threshold state, with negative charge on the floating gate) will not conduct, i.e., storing a logic zero.

Figure 4A:
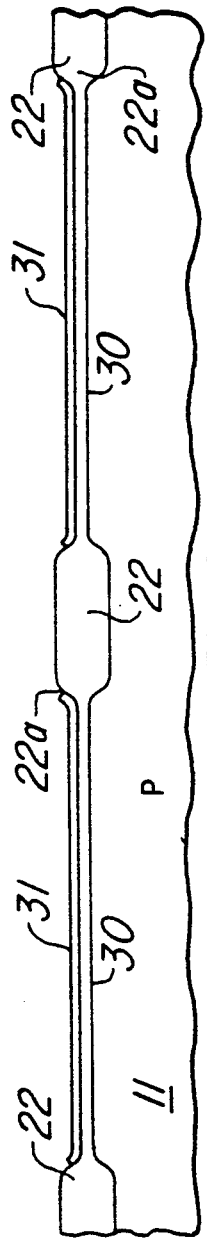
FIGS. 4a-4d are elevation views in section, corresponding to FIG. 2a, of the device of FIGS. 1 and 2a-2e at successive stages in the manufacture thereof.

A method of making the device of FIGS. 1 and 2a-2e will be described in reference to FIGS. 4a-4d. The starting material is a slice of P-type silicon of which the substrate 11 is only a very small portion. The slice is perhaps 6 inches in diameter, while the portion shown in FIG. 1 is only a few microns wide. A number of process steps would be performed to create transistors peripheral to the array, and these will not be discussed here. For example, the memory device may be of the complementary field-effect type in which N-wells and P-wells are formed in the substrate 11 as part of the process to create peripheral transistors. The first step related to the cell array of the invention is applying oxide and silicon nitride coatings 30 and 31 as seen in FIG. 4a, and patterning these coatings using photoresist to leave nitride over what will be the channel regions, the sources, the drains, and the bitlines 13, while exposing the areas where the thick field oxide 21 and 22 is to be formed. A boron implant at about $8 \times 10^{12}$ cm$^{-2}$ dosage is performed to create a P+ channel stop beneath the field oxide 21 and 22. Then the field oxide 21 and 22 is grown to a thickness of about 9000 A by exposing to steam at about 900° for several hours. The thermal oxide grows beneath the edges of the nitride 31, creating a "bird's beak" 22a instead of a sharp transition.

Figure 4B:
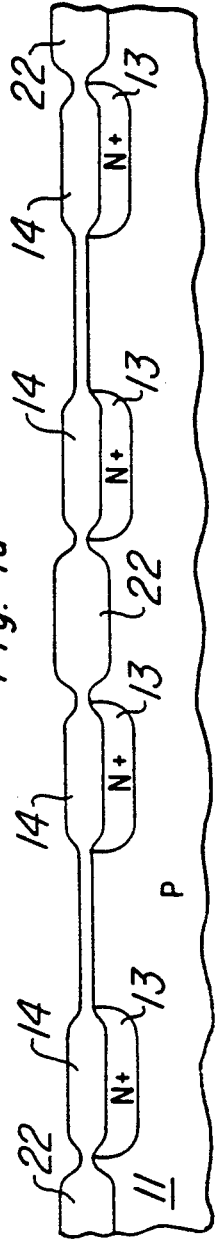

Turning now to FIG. 4b, the nitride 31 is removed and, in the area where the bitlines 13 are to be formed, an arsenic implant is done at a dosage of about $6 \times 10^{15}$ cm$^{-2}$ at 135 KeV, using photoresist as an implant mask, to create the source/drain regions and bitlines. Next, another thermal oxide is grown on the face to a thickness of about 2500 to 3500 A over the N+ buried bitlines, during which time a thermal oxide of about 300 A will grow over the non-doped channel areas (due to the differential oxidation occurring when heavily-doped and lightly-doped silicon areas are exposed to oxidation at the same time), to create the oxide layers 14 above the source/drain regions and bitlines 13. This oxidation is in steam at about 800° to 900° C. At the transition areas 18 where the bird's beak 22a has been formed, the edge of the originally-formed thermal oxide has masked the arsenic implant so the concentration is lower and so the oxide growth in that area is less than that of the oxide 14 or the oxide 22.

Figure 4C:
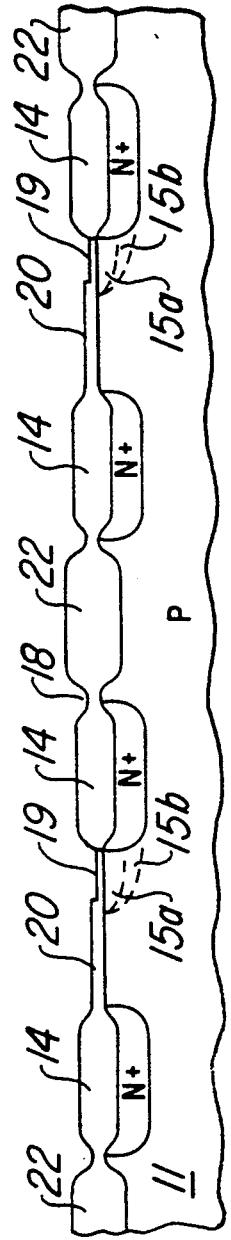
Figure 4D:
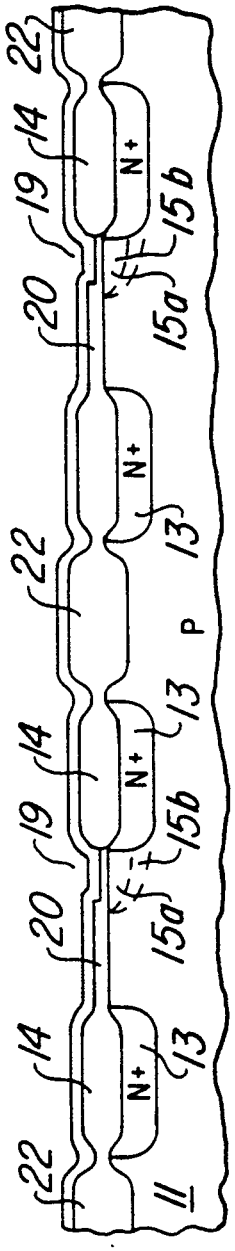

Referring now to FIG. 4c, a window 19 (also seen in FIG. 1) is opened in the gate oxide 20. This is done using photoresist as a mask, and etching through the oxide 20 to the bare silicon, then growing a thin oxide 19 to form tunnel window 19. During formation of the tunnel window 19 oxide, the thickness of gate oxide 20 will increase to approximately 350 A.

Referring now to FIG. 2a, first polysilicon layer, doped N+, is now applied to the face of the silicon slice, and a coating 34 of oxide, or oxide-nitride-oxide, is applied to separate the two polysilicon levels. The first-level polysilicon is defined using photoresist to leave elongated strips in the Y-direction, parts of which will become the floating gates 17. An oxidation, performed after the first-level polysilicon is defined, covers the edges of first-level polysilicon, and also creates the gate oxide 35 for the series enhancement transistor 36. A second polysilicon layer is deposited, doped N+, and patterned using photoresist to create the wordlines/control gates 12. At the same time as the wordlines/control gates 12 are defined, the edges of the first-level polysilicon are etched, so that the elongated X-direction edges of the floating gates are self-aligned with the edges of the control gates.

Optionally, the junction profile on the channel side of source 15 may be tailored to make certain that it terminates under the 350 A gate oxide 20, extending over the entire lower surface of window 19 and thereby maximizing the field-plate breakdown voltage of the source junction. Extension 15a or 15b of source 15 extends past the window 19 area and greatly increases the possibility that erasure will be purely by Fowler-Nordheim tunneling and not by hot carriers. For example, extension 15a may be formed to extend source 15 completely under the lower surface of window 19 by implanting a N-type impurity in window 19 prior to or after growing the 100 A coating. An alternative procedure is to include phosphorus as one of the doping materials used to form source 15, then subjecting the slice to a temperature cycle that causes the phosphorus to diffuse laterally under window 19 to form extension 15b.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. An electrically programmable read-only memory cell formed at a face of a semiconductor layer of a first conductivity type, comprising:

first and second source/drain regions formed at said face to be of a second conductivity type opposite said first conductivity type, a channel region of said semiconductor layer spacing apart said source/drain regions;

a differentially grown source/drain insulator region formed over at least said first source/drain region;

a thin tunnel insulator layer formed on said face to be adjacent said first source/drain region;

a laterally isolating thick insulator region formed on said face adjacent each of said first and second source/drain regions, each said laterally isolating insulator region isolating a respective one of said source/drain regions from a source/drain region of a next adjacent cell;

said channel region, said first source-drain insulator region and said thick insulator regions being linearly arranged in one direction, a floating gate conductor insulatively disposed over at least a portion of said channel region, over said first source/drain insulator region, to adjoin said thin tunnel insulator layer, and completely over, in said one direction, said laterally isolating insulator region;

a control gate conductor insulatively disposed adjacent said floating gate conductor and capacitively coupled thereto at least over said isolating insulator region; and channel isolating thick insulator regions formed at said face adjacent said channel region and adapted to isolate said channel region from channel regions of adjacent cells.

2. The cell of claim 1, and further comprising a second source/drain insulator region formed over said second source/drain region.

3. The cell of claim 2, wherein a source/drain insulator region is formed over said source/drain region of said next adjacent cell, said floating gate conductor extending over a portion of the last said source/drain insulator region.

4. The cell of claim 1, and further comprising a gate insulator layer spacing said channel region from said floating gate conductor, said tunnel insulator layer formed at said face and entirely on said first source/drain region to be thinner than said gate insulator layer.

5. The memory cell of claim 1, wherein said floating gate conductor and said control gate conductor are polycrystalline silicon layers.

6. The memory cell of claim 1, wherein said control gate conductor is part of an elongated word line extending along said face, and wherein each said source/drain region is a part of an elongated bit line extending along said face perpendicular to said word line.

7. An array of electrically programmable read-only memory cells formed at a face of a semiconductor layer of a first conductivity type, said cells formed in columns and in rows formed at an angle to said columns, the array comprising:

for each column, a pair of source/drain regions formed at said face to be of a second conductivity type opposite said first conductivity type;

for each cell, a channel area of said semiconductor layer spacing said source/drain regions, one cell formed at each intersection of a row and a column;

a thick source/drain insulator region differentially grown on said face over each said source/drain region;

for each cell, a thin tunnel insulator layer formed adjacent one of said source/drain regions;

for each pair of columns, a thick laterally isolating insulator layer formed therebetween for isolating a source/drain region in one of said pair of columns from a source/drain region in the other of said pair of columns;

for each cell, a floating gate conductor insulatively disposed over at least a portion of a respective channel area, and extending in a row direction over at least one of said source/drain insulator regions and completely over, in a row direction, a laterally isolating insulator region adjacent said one of said source/drain insulator regions;

for each row, a control gate conductor insulatively disposed adjacent each said floating gate conductor in said row, and coupled thereto at least over said laterally isolating insulator layers; and for each pair of cells in a column direction, a thick channel-isolating insulator layer formed between the channel areas of said pair of cells to isolate the channel areas from one another.

8. The array of claim 7, wherein for each cell, said floating gate conductor thereof extends in a row direction over another of said source/drain insulator regions of a next adjacent cell.

9. The array of claim 7, and further comprising, for each cell, a floating gate insulator layer spacing said channel area thereof from said floating gate conductor thereof, said tunnel insulator layer thinner than said gate insulator layer.

10. The array of claim 7, wherein each control gate conductor is capacitively coupled to each floating gate conductor in a respective row throughout each floating gate conductor's length in a row direction.

* * * * *